United States Patent
Sung (10) Patent No.: US 10,782,931 B2
(45) Date of Patent: Sep. 22, 2020

(54) CONTROL SYSTEM, CONTROL METHOD AND NONVOLATILE COMPUTER READABLE MEDIUM FOR OPERATING THE SAME

(71) Applicant: Realtek Semiconductor Corporation, Hsinchu (TW)

(72) Inventor: Lien-Hsiang Sung, Taoyuan (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 16/420,410

(22) Filed: May 23, 2019

(65) Prior Publication Data

US 2020/0201599 A1 Jun. 25, 2020

(30) Foreign Application Priority Data

Dec. 21, 2018 (TW) ............................... 107146552 A (51) Int. Cl.
*G06F 5/14* (2006.01)
*G11C 11/41* (2006.01)

(52) U.S. Cl.
CPC ................ *G06F 5/14* (2013.01); *G11C 11/41* (2013.01)

(58) Field of Classification Search
None
See application file for complete search history.

(56) References Cited

U.S. PATENT DOCUMENTS

| | | | | |
|---|---|---|---|---|
| 6,725,391 B2 * | 4/2004 | Swoboda | ............ | G06F 11/3636 713/400 |
| 6,980,552 B1 * | 12/2005 | Belz | ........................ | H04L 47/10 370/392 |
| 7,107,393 B1 * | 9/2006 | Sabih | ........................ | G06F 5/08 711/109 |
| 7,310,396 B1 * | 12/2007 | Sabih | ........................ | G06F 5/06 375/354 |
| 8,094,562 B1 * | 1/2012 | Baumbach | .............. | H03L 7/104 370/236 |
| 2004/0165609 A1 * | 8/2004 | Herbst | ..................... | H04L 12/56 370/412 |
| 2008/0141063 A1 * | 6/2008 | Ridgeway | ................. | G06F 5/12 713/501 |

(Continued)

FOREIGN PATENT DOCUMENTS

CN 1571957 A 1/2005

*Primary Examiner* — Michael Sun
(74) *Attorney, Agent, or Firm* — Locke Lord LLP; Tim Tingkang Xia, Esq.

(57) ABSTRACT

A control system includes a data access circuit and a control circuit. The system coordinates an asynchronous FIFO process between a write circuit operating according to a first clock and a read circuit operating according to a second clock. The data access circuit controls the write circuit to write data into a memory buffer and controls the read circuit to read the data from the memory buffer. The control circuit generates a write index according to the first clock and a read index according to the second clock. The control circuit calculates multiple water levels according to the write index and the read index and obtains a median water level. The control circuit controls the access circuit to execute the asynchronous FIFO process at a time point corresponding to the median water level, so that a data exchange is performed via the memory buffer.

20 Claims, 5 Drawing Sheets

(56) References Cited

U.S. PATENT DOCUMENTS

| | | | |
|---|---|---|---|
| 2009/0019193 A1* | 1/2009 | Luk | G06F 5/06 710/52 |
| 2013/0205160 A1* | 8/2013 | Turner | G06F 5/12 713/400 |
| 2014/0089718 A1* | 3/2014 | Kain | G06F 5/06 713/500 |
| 2014/0089720 A1* | 3/2014 | Schmit | G06F 13/42 713/501 |
| 2015/0205579 A1* | 7/2015 | Mendel | G06F 5/14 710/57 |

* cited by examiner

CONTROL SYSTEM, CONTROL METHOD AND NONVOLATILE COMPUTER READABLE MEDIUM FOR OPERATING THE SAME

CROSS-REFERENCE TO RELATED APPLICATION

This application claims priority to Taiwan Application Serial Number 107146552, filed on Dec. 21, 2018, which is herein incorporated by reference.

BACKGROUND

Technical Field

The present disclosure relates to a control system, a control method and a computer readable medium thereof. More particularly, the present disclosure relates to a system, a method and a computer readable medium for coordinating asynchronous first-in first-out (FIFO) processes.

Description of Related Art

In the prior art, there are no specific mechanisms designed for asynchronous first-in first-out processes. As a result, a large memory buffer is required to prevent overflow writing or reading underflow.

SUMMARY

One embodiment of the disclosure relates to a control system that coordinates an asynchronous first-in first out process between a write circuit operating according to a first clock and a read circuit operating according to a second clock. The control system includes a data access circuit and a control circuit. The data access circuit controls the write circuit to write multiple data into a memory buffer and control the read circuit to read the plurality of data. The control circuit establishes a count according to the first clock to generate a write index and establishes a count according to the second clock to generate a read index. The control circuit further calculates multiple water levels according to the write index and the read index in a time interval and calculates a median water level according to the water levels. The control circuit further controls the data access circuit to perform the asynchronous first-in first-out process at a time point corresponding to the median water level so that the write circuit and the read circuit exchange the multiple data via the memory buffer.

Another embodiment of the disclosure relates to a control method that coordinates an asynchronous first-in first-out process between a write circuit operating according to a first clock and a read circuit operating according to a second clock. The control method includes steps of establishing a count according to the first clock to generate a write index and establishing a count according to the second clock to generate a read index; calculating multiple water levels according to the write index and the read index in a time interval; calculating a median water level according to the water levels; and controlling a data access circuit to perform the asynchronous first-in first-out process at a time point corresponding to the median water level so that the write circuit and the read circuit exchange multiple data via the memory buffer.

Still another embodiment of the disclosure relates to a non-volatile computer readable medium associated with at least one instruction that defines a control method. The control method coordinates an asynchronous first-in first-out process between a write circuit operating according to a first clock and a read circuit operating according to a second clock. The control method includes steps of establishing a count according to the first clock to generate a write index and establishing a count according to the second clock to generate a read index; calculating multiple water levels according to the write index and the read index in a time interval; calculating a median water level according to the multiple water levels; and controlling a data access circuit to perform the asynchronous first-in first-out process at a time point corresponding to the median water level so that the write circuit and the read circuit exchange multiple data via the memory buffer.

DETAILED DESCRIPTION

Figure 1:
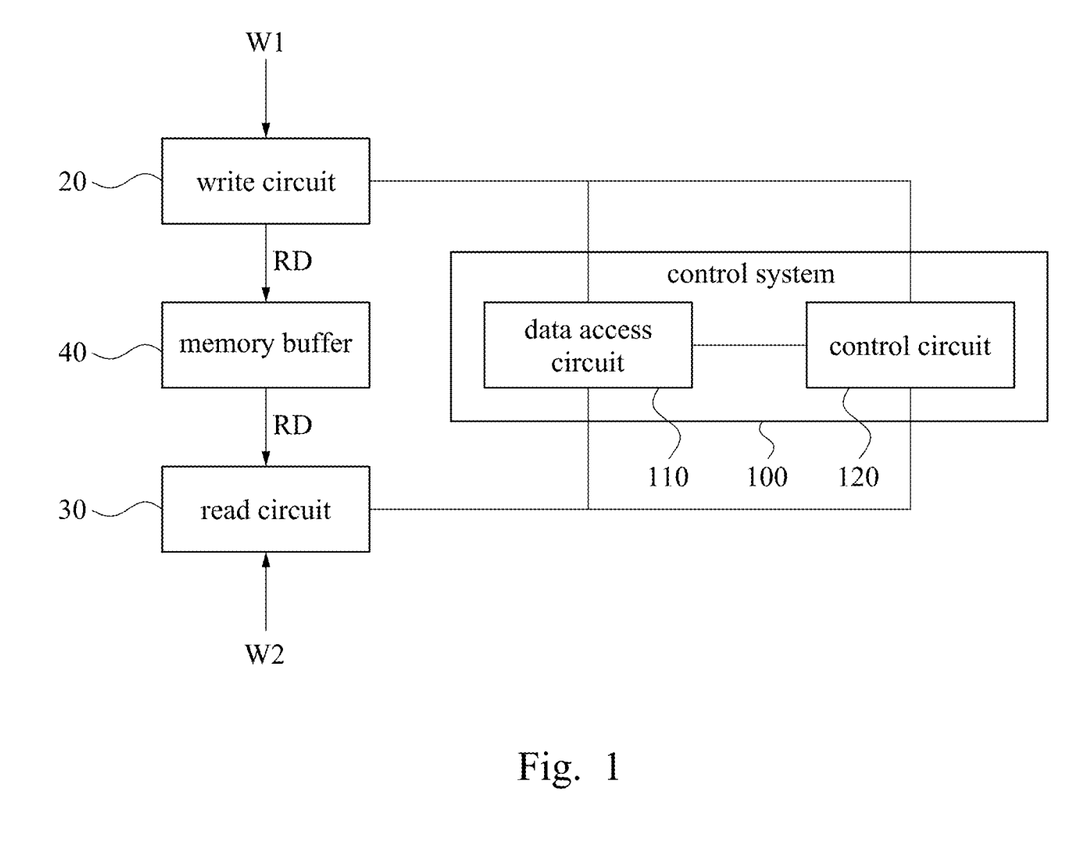
FIG. 1 is a schematic diagram showing a control system according to one embodiment of present disclosure.

FIG. 1 is a schematic diagram showing a control system according to one embodiment of present disclosure. The control system 100 is coupled to a write circuit 20 and a read circuit 30. The control system 100 includes a data access circuit 110 and a control circuit 120.

The data access circuit 110 is coupled to the write circuit 20 and the read circuit 30. The data access circuit 110 may be configured to control the write circuit 20 to perform a data writing process and control the read circuit 30 to perform a data reading process.

The control circuit 120 is coupled to the write circuit 20 and the read circuit 30. When the data access circuit 110 controls the write circuit 20 to perform the data writing process and controls the read circuit 30 to perform the data reading process, the control circuit 120 may be configured to collect information in order to control the operations of the write circuit 20 and the read circuit 30.

The write circuit 20 is configured to operate according to a clock W1 and the read circuit 30 is configured to operate according to a clock W2. The clock W1 is different from the clock W2. To allow for better understanding, reference may be made to FIG. 2. The clock W1 has a center frequency F1. The clock W2 has a center frequency F2. In the embodiment, the center frequency F1 and the center frequency F2 are identical so that each data writing process writes the same number of digits as are read in each data reading process. For instance, the center frequency F1 and the center frequency F2 may be 100 MHz. In this case, each data writing process may write 32 digits and each data reading process may read 32 digits. Through such an operation, in the same time interval, the write circuit 20 may write the same number of digits as the read circuit 30 reads. In this time interval, the clock W1 and the clock W2 have the same number of pulses.

Figure 2:
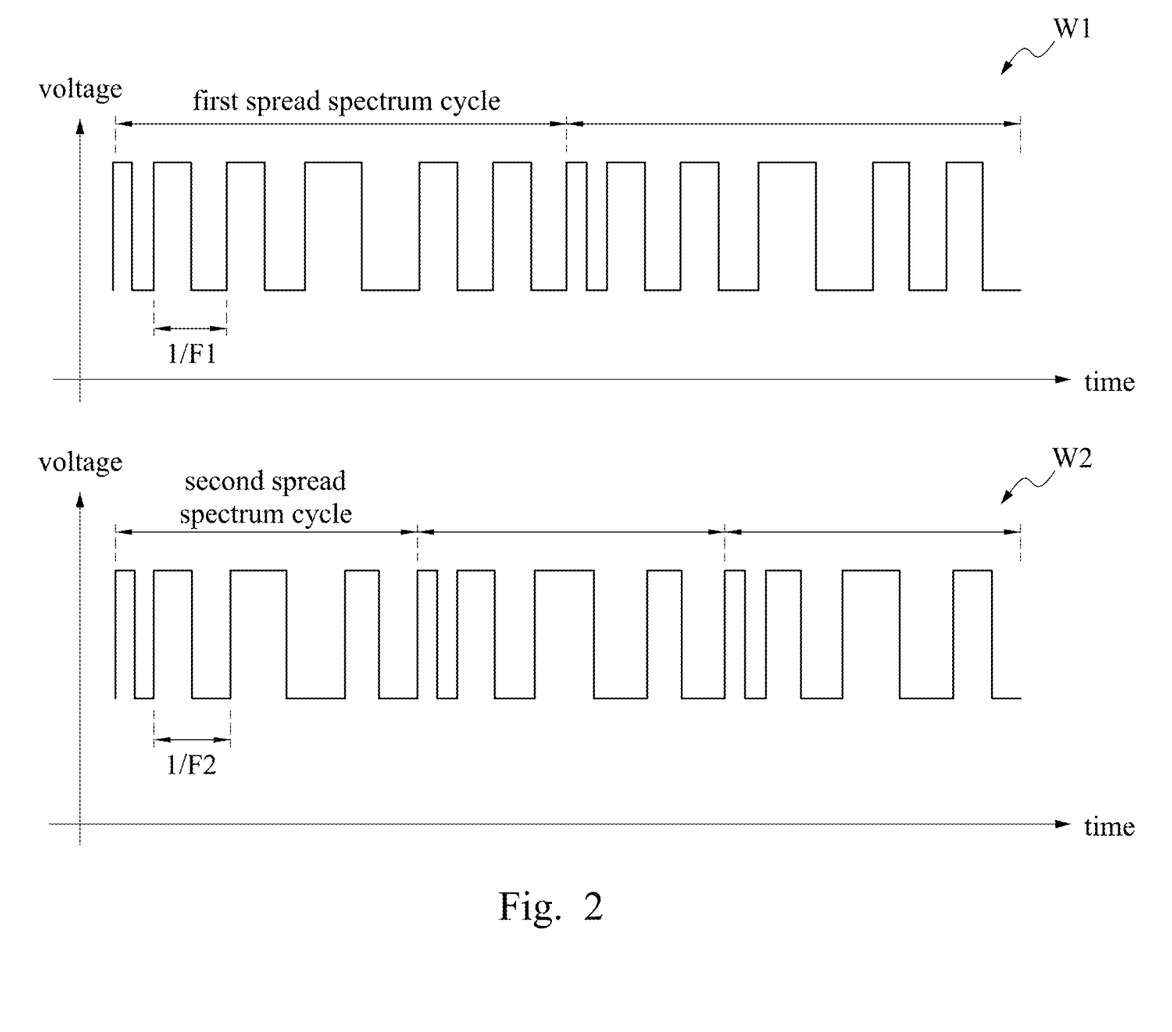
FIG. 2 is a schematic diagram showing clock signals according to one embodiment of present disclosure.

For example, as shown in FIG. 2, regarding the clock W1, said time interval includes 2 first spread spectrum cycles and each of the first spread spectrum cycles has 6 pulses; regarding the clock W2, said time interval includes 3 second spread spectrum cycles and each of the second spread spectrum cycles has 4 pulses. That is to say, in said time interval, the clock W1 and the clock W2 both have 12 pulses.

In some embodiments, the center frequency F1 of the clock W1 and the center frequency F2 of the clock W2 may be different. The ratio of the center frequency F1 to the center frequency F2 may be a first ratio. Correspondingly, a ratio of the digits written by the write circuit 20 in each data writing process to the digits read by the read circuit 30 in each data reading process may be a second ratio. In such an embodiment, the first ratio and the second ratio may have a negative relationship. In other words, the write circuit 20 and the read circuit 30 have the same throughput in a time interval. In such a time interval, the ratio of pulses of the clock W1 to pulses of the clock W2 may be represented by the first ratio. For example, the center frequency F1 may be 100 MHz and the center frequency F2 may be 50 MHz so that the first ratio is 2:1. In a corresponding manner, the write circuit 20 may write 32 digits in one pulse and the read circuit 30 may read 64 digits in one pulse, such that the second ratio is 1:2. Furthermore, in such a time interval, the pulses of the clock W1 and the pulses of the clock W2 may also be represented by the first ratio, which is 2:1.

In some embodiments, the center frequency F1 of the clock W1 and the center frequency F2 of the clock W2 may be different. The ratio of the center frequency F1 to the center frequency F2 may be a first ratio. The write circuit 20 may perform one data writing process each M pulses and the read circuit 30 may perform one data reading process each N pulses. The digits written by the write circuit 20 in each data writing process and the digits read by the read circuit 30 in each data reading process are the same. The ratio of the value of M to the value of N may be a second ratio. In such an embodiment, the first ratio and the second ratio may have a negative relationship. In other words, the write circuit 20 and the read circuit 30 have the same throughput in a time interval. For example, the center frequency F1 may be 100 MHz, and the center frequency F2 may be 50 MHz so that the first ratio is 2:1. In a corresponding manner, the write circuit 20 may write 32 digits in one pulse, and the read circuit 30 may read 64 digits in one pulse, such that the second ratio is 1:2. Furthermore, in such a time interval, the pulses of the clock W1 and the pulses of the clock W2 may also be represented in the first ratio, which is 2:1. Correspondingly, the write circuit 20 may perform one data writing process each 2 pulses and the read circuit 30 may perform one data reading process each pulse. The write circuit 20 may write 32 digits in each data writing process and the read circuit 30 may read 32 digits in each data reading process.

It is noted that the above embodiments are not intended to limit the configurations (or patterns) of the clock W1, the clock W2, the write circuit 20 and the read circuit 30. The present disclosure is applicable to cases in which the write circuit 20 and the read circuit 30 have the same throughputs in a fixed time interval. In the above embodiments (of the same or different center frequencies), since the write circuit 20 and the read circuit 30 operate according to different clocks, the process may be considered a process of clock domain crossing data access.

Figure 3:
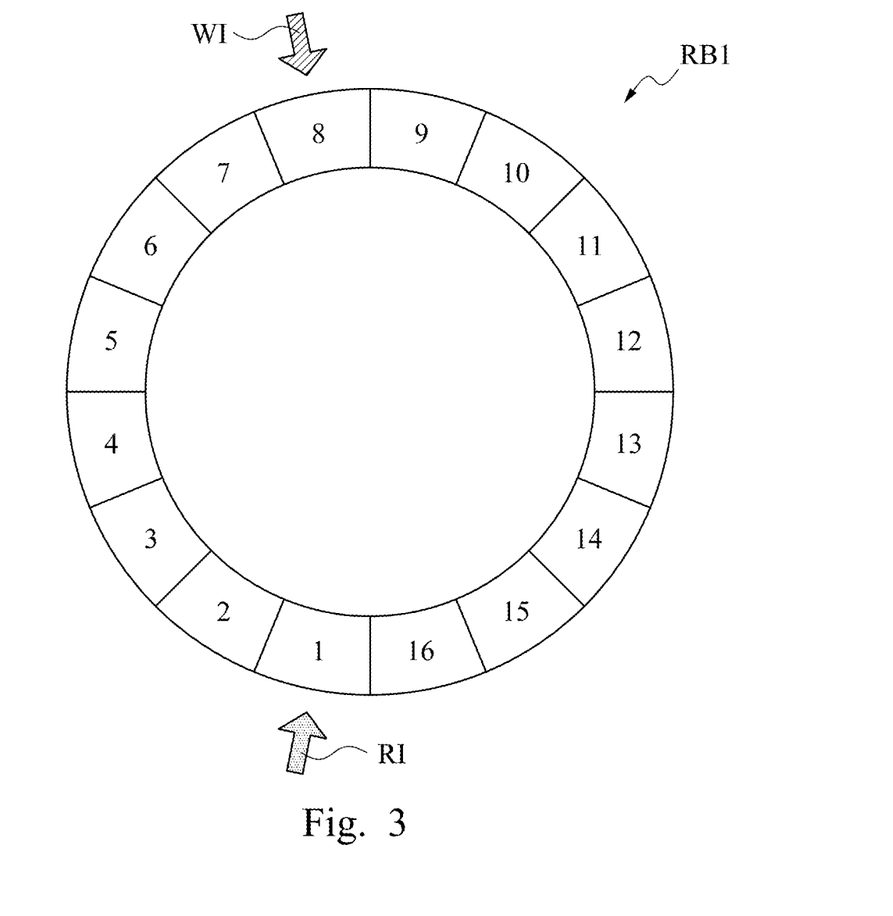
FIG. 3 is a schematic diagram showing a memory buffer according to one embodiment of present disclosure.

In some embodiments, a memory buffer 40 may be a ring buffer. For better understanding, reference may be made to FIG. 3. As shown in FIG. 3, the memory buffer 40 may be implemented using a ring buffer RB1. The ring buffer RB1 is substantially divided into 16 sections represented using digits 1-16. Each section of the ring buffer RB1 may correspond to a specific memory volume for storing a data element. The data elements have sizes which substantially match the sections in which they are stored. When a batch of data is written to the ring buffer RB1, each section of the ring buffer RB1 may store data elements in the batch of data successively. However, it should be understood that such storage "successively" is not always started from the section marked by "1." It is noted that, in the embodiments above, the configuration of the ring buffer RB1 is exemplary, and the numbers of sections and the volumes of these sections in the ring buffer RB1 are not limited thereto.

In some embodiments, the memory buffer 40 may be configured by a static random-access memory. The write circuit 20 may be configured to control some transistors and word lines in the static random-access memory to operate the static random-access memory in a write mode. The read circuit 30 may also be configured to control some transistors and word lines in the static random-access memory to operate the static random-access memory in a read mode.

In some embodiments, the memory buffer 40 may be configured by multiple flip-flops.

Figure 4:
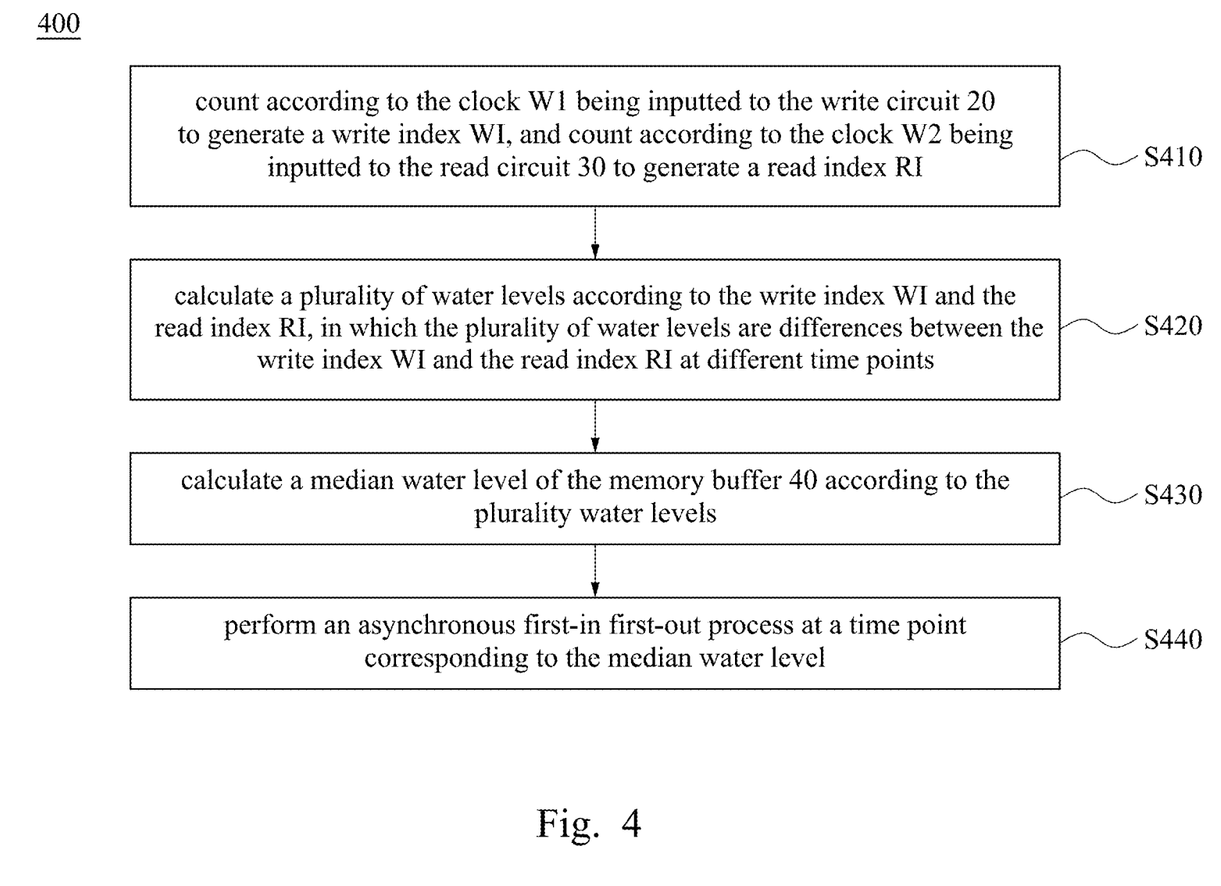
FIG. 4 is a flow chart illustrating a control method according to one embodiment of present disclosure.

For better understanding of the control system 100 in FIG. 1, reference may be made to FIG. 4. FIG. 4 is a flow chart of a control method according to one embodiment of present disclosure. The control method 400 includes steps S410-S440. The steps S410-S440 may be executed by the control system 100 in FIG. 1.

In some embodiments, the control method 400 may be defined by at least one instruction. The at least one instruction may be stored in a non-transitory computer readable medium and executed by at least one processing circuit.

Step S410: count according to the clock W1 being inputted to the write circuit 20 to generate a write index WI, and count according to the clock W2 being inputted to the read circuit 30 to generate a read index RI.

In some embodiments, the control circuit 120 may count the rising edges (or the falling edges) of the clock W1 to get a write index WI. The control circuit 120 may count the rising edges (or the falling edges) of the clock W2 to get a read index RI.

In some embodiments, the data access circuit 110 may control the write circuit 20 to write virtual data into the memory buffer 40 according to the clock W1. The data access circuit 110 may control the read circuit 30 to read the virtual data from the memory buffer 40 according to the clock W2. The control circuit 120 may establish the count when the write circuit 20 is performing the data writing process to generate the write index WI and establish the count when the read circuit 30 is performing the data reading process to generate the read index RI. In some embodiments, the virtual data may be stored in a register (not shown) of the write circuit 20. However, the present disclosure is not limited thereto. It is understood that the operation may be considered a "virtual" asynchronous first-in first-out process based on the virtual data.

In some embodiments, the data access circuit 110 may set the write index WI to a first predetermined value and set the read index RI to a second predetermined value. The difference between the first predetermined value and the second predetermined value corresponds to a predetermined water level (also referred to as a difference value). For instance, if the first predetermined value is 8 and the second predetermined value is 0, the predetermined water level would be 8. Subsequently, the control circuit 120 may start to count according to the clock W1 to get the write index WI, and to count according to the clock W2 to get the read index RI.

Step S420: calculate a plurality of water levels according to the write index WI and the read index RI, in which the plurality of water levels are differences between the write index WI and the read index RI at different time points.

In some embodiments, the control circuit 120 may record the write index WI and the read index RI in a time interval (e.g., at least one cycle) to calculate the plurality of values of water level. For example, in the above case, the predetermined value of the write index WI is "8" and the predetermined value of the read index RI is "0." At the time that a pulse of the clock W2 has passed and a pulse of the clock W1 has not come yet, the write index WI is still "8" but the read index RI goes to "1." In this case, the water level may be read "7."

In some embodiments, when the data access circuit 110 controls the write circuit 20 and the read circuit 30 performs the virtual asynchronous first-in first-out process based on the virtual data, the control circuit 120 may calculate these water levels accordingly. Referring to FIG. 3, in an example, each section of the ring buffer RB1 is capable of storing one data element. The write index WI is preset to "8" and the read index RI is preset to "0." After a pulse of the clock W1 and before a pulse of the clock W2, the write circuit 20 may write a data element into the memory buffer 40 so that the write index WI is read "9." Since the read circuit 30 has yet to read data from the memory buffer 40, the read index RI is still "0." At this time, the water level is read on "9." In the case where the indication of the write index WI has jumped from the section marked with the maximum digit to the one marked with the minimum digit and the indication of the read index RI has not yet gone to the section marked with the minimum digit, the value of the water level may be calculated by summing up a difference between the write index WI and the read index RI and the numbers of the ring buffer. For instance, when the indication of the write index WI is cycled from "16" to "1" and the indication of the read index RI is "9," the value of the water level may be calculated by 1−9+16=8.

Step S430: calculate a median water level of the memory buffer 40 according to the plurality water levels.

In some embodiments, the control circuit 120 may record a plurality of water levels in a time interval and calculate a median water level according to the plurality of water levels. In some embodiments, the median water level may be an average of a maximum water level and a minimum water level in the time interval. For instance, if the maximum water level in the time interval is 16 and the minimum water level in the time interval is 8, the median water level may be 12.

In some embodiments, if the median water level is not an integer, the control circuit 120 may round off or round up the median water level.

Step S440: perform an asynchronous first-in first-out process at a time point corresponding to the median water level.

In some embodiments, when the control circuit 120 gets the median water level, the control circuit 120 may control the data access circuit 110 to execute an asynchronous first-in first-out process based on the real data. For example, if the median water level retrieved by the control circuit 120 is 12, the data access circuit 110 may execute the asynchronous first-in first-out process based on real data RD at a time point corresponding to the median water level.

In some embodiments, when the control circuit 120 obtains the median water level, the control circuit 120 may control the data access circuit 110 to write a predetermined amount of data (e.g., the real data RD that the data access circuit 110 controls the write circuit 20 to write). Next, the control circuit 120 may control the data access circuit 110 to execute an asynchronous first-in first-out process based on the real data RD at the time point corresponding to the water level median. To perform the asynchronous first-in first-out process, the data access circuit 110 may control the write circuit 20 to write the real data RD into the memory buffer 40 according to the clock W1, and control the read circuit 30 to read the real data RD from the memory buffer 40 according to the clock W2.

Figure 5:
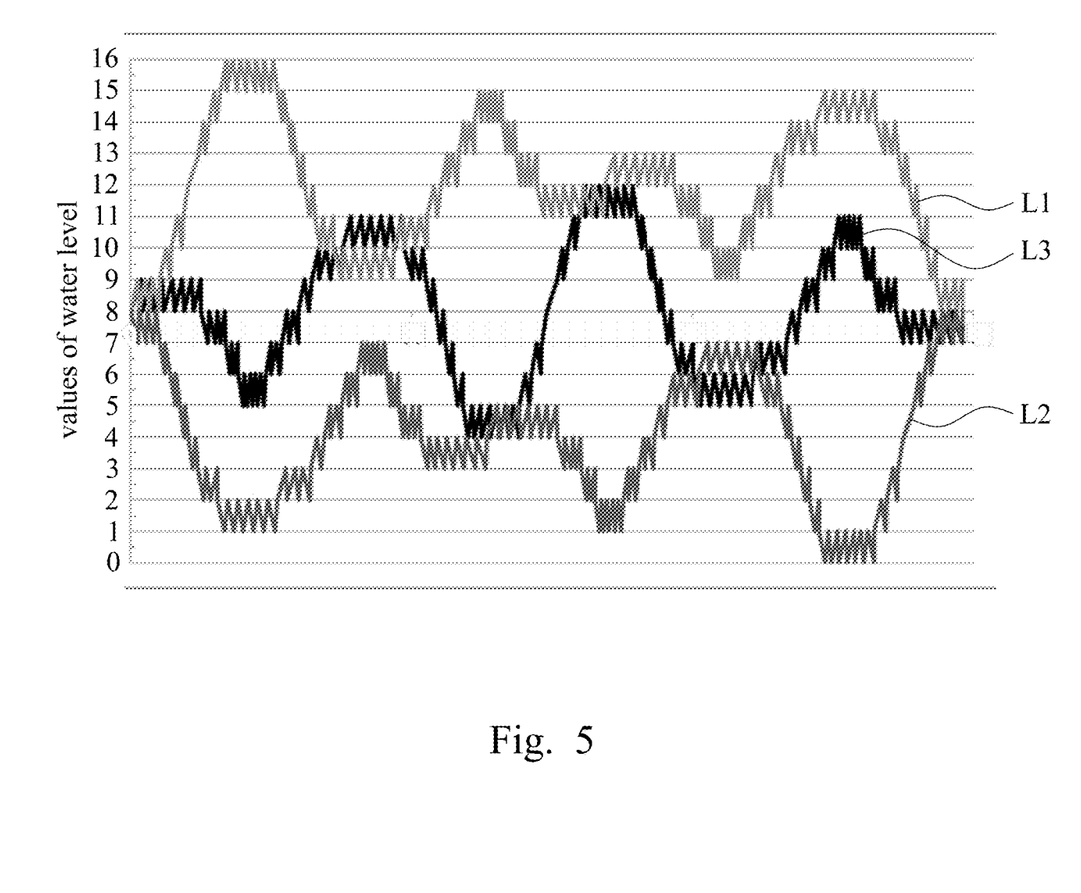
FIG. 5 is a schematic diagram showing water levels of the memory buffer according to one embodiment of present disclosure.

For better understanding, reference is made to FIG. 5. FIG. 5 is a schematic diagram showing some water levels of the memory buffer according to one embodiment of present disclosure. In the embodiment, the control circuit 120 may control the data access circuit 110 to write 8 data elements into the memory buffer 40 in advance. In this figure, lines L1 and L2 show the water levels when the asynchronous first-in first-out process is performed at some random time points. A line L3 shows the water levels when the asynchronous first-in first-out process is performed at the time point corresponding to the water level median.

There are 16 possible water levels shown in FIG. 5. In the case where the asynchronous first-in first-out process is performed at a random time point but not controlled by the control system 100 of the present disclosure, the water level may vary from 8-16, as the polyline L1 shows. In the case where the asynchronous first-in first-out process is performed at another random time point, the water level may vary from 0-8, as the polyline L2 shows. In these two cases, to perform the asynchronous first-in first-out process, a 16-level memory buffer is required.

In contrast, the control system 100 of the present disclosure may obtain the median water level of the memory buffer and establish the asynchronous first-in first-out process at the time point corresponding to the median water level. The polyline L3 shows that the water level of the memory buffer has a range of 4-12. In such a case, to perform the asynchronous first-in first-out process, a smaller memory buffer is enough. This approach reduces the manufacturing cost of the memory buffers.

According to the foregoing embodiments, the present disclosure provides a control system, a control method and a computer readable medium thereof to control the write circuit and the read circuit to perform the asynchronous first-in first-out process at precise time points. The approach allows a smaller memory to run the process. The approach also reduces failure rate with overflow or underflow on normal memories.

What is claimed is:

1. A control system, configured to coordinate an asynchronous first-in first-out process between a write circuit operating according to a first clock and a read circuit operating according to a second clock, the control system comprising:
 a data access circuit, configured to control the write circuit to write a plurality of data into a memory buffer and control the read circuit to read the plurality of data; and
 a control circuit, configured to establish a count according to the first clock to generate a write index, and to establish a count according to the second clock to generate a read index, wherein the control circuit is further configured to calculate a plurality of water level values according to the write index and the read index in a time interval and calculate a median water level value according to the plurality of water level values;
 wherein the control circuit is further configured to control the data access circuit to perform the asynchronous first-in first-out process at a time point when a value of a water level is equal to the median water level value so that the write circuit and the read circuit exchange the plurality of data via the memory buffer.

2. The control system of claim 1, wherein the control circuit is configured to store the write index and the read index in the time interval and determine the plurality of water level values according to differences between the write index and the read index.

3. The control system of claim 1, wherein the write circuit and the read circuit are identical in throughputs in the time interval.

4. The control system of claim 1, wherein the first clock and the second clock are identical in center frequencies, or the first clock and the second clock have different center frequencies.

5. The control system of claim 1, wherein the control circuit is further configured to calculate the median water level value according to a maximum water level value in the time interval and a minimum water level value in the time interval.

6. The control system of claim 1, wherein the memory buffer is a ring buffer or a static random access memory.

7. The control system of claim 1, wherein after the control circuit obtains the median water level value and the data access circuit writes part of the plurality of data into the memory buffer, the control circuit controls the data access circuit to perform the asynchronous first-in first-out process so that the write circuit and the read circuit exchange the plurality of data via the memory buffer.

8. A control method, configured to coordinate an asynchronous first-in first-out process between a write circuit operating according to a first clock and a read circuit operating according to a second clock, the control method comprising:
    establishing a count according to the first clock to generate a write index and establishing a count according to the second clock to generate a read index;
    calculating a plurality of water level values according to the write index and the read index in a time interval;
    calculating a median water level value according to the plurality of water level values; and
    controlling a data access circuit to perform the asynchronous first-in first-out process at a time point when a value of a water level is equal to the median water level value so that the write circuit and the read circuit exchange a plurality of data via the memory buffer.

9. The control method of claim 8, further comprising:
    storing the write index and the read index in the time interval and determining the plurality of water level values according to differences between the write index and the read index.

10. The control method of claim 8, wherein the write circuit and the read circuit are identical in throughputs in the time interval.

11. The control method of claim 8, wherein the first clock and the second clock are identical in center frequencies, or the first clock and the second clock have different center frequencies.

12. The control method of claim 8, wherein the control circuit is further configured to calculate the median water level value according to a maximum water level value in the time interval and a minimum water level value in the time interval.

13. The control method of claim 8, further comprising:
    after the control circuit obtains the median water level value and the data access circuit writes part of the plurality of data into the memory buffer, controlling the data access circuit to perform the asynchronous first-in first-out process so that the write circuit and the read circuit exchange the plurality of data via the memory buffer.

14. A non-volatile computer readable medium, associated with at least one instruction that defines a control method, in which the control method coordinates an asynchronous first-in first-out process between a write circuit operating according to a first clock and a read circuit operating according to a second clock, and the control method comprising:
    establishing a count according to the first clock to generate a write index and establishing a count according to the second clock to generate a read index;
    calculating a plurality of water level values according to the write index and the read index in a time interval;
    calculating a median water level value according to the plurality of water level values; and
    controlling a data access circuit to perform the asynchronous first-in first-out process at a time point when a value of a water level is equal to the median water level value so that the write circuit and the read circuit exchange a plurality of data via the memory buffer.

15. The non-volatile computer readable medium of claim 14, wherein the control method further comprises:
    storing the write index and the read index in the time interval and determining the plurality of water level values according to differences between the write index and the read index.

16. The non-volatile computer readable medium of claim 14, wherein the write circuit and the read circuit are identical in throughputs in the time interval.

17. The non-volatile computer readable medium of claim 14, wherein the first clock and the second clock are identical in center frequencies, or the first clock and the second clock have different center frequencies.

18. The non-volatile computer readable medium of claim 14, wherein the control circuit is further configured to calculate the median water level value according to a maximum water level value in the time interval and a minimum water level value in the time interval.

19. The non-volatile computer readable medium of claim 14, wherein the memory buffer is a ring buffer or a static random access memory.

20. The non-volatile computer readable medium of claim 14, wherein the control method further comprises:
    after the control circuit obtains the median water level value and the data access circuit writes part of the plurality of data into the memory buffer, controlling the data access circuit to perform the asynchronous first-in first-out process so that the write circuit and the read circuit exchange the plurality of data via the memory buffer.

* * * * *